United States Patent
Tanaka et al.

(10) Patent No.: US 10,115,777 B2
(45) Date of Patent: Oct. 30, 2018

(54) DISPLAY DEVICE

(71) Applicant: Japan Display Inc., Tokyo (JP)

(72) Inventors: Masaki Tanaka, Tokyo (JP); Hajime Akimoto, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/492,093

(22) Filed: Apr. 20, 2017

(65) Prior Publication Data

US 2017/0330920 A1    Nov. 16, 2017

(30) Foreign Application Priority Data

May 16, 2016   (JP) .................................. 2016-097999

(51) Int. Cl.
| | | |
|---|---|---|
| *H04L 27/00* | (2006.01) | |
| *H01L 27/32* | (2006.01) | |
| *H01L 51/52* | (2006.01) | |
| *H01L 27/28* | (2006.01) | |

(52) U.S. Cl.
CPC ........ *H01L 27/3246* (2013.01); *H01L 27/288* (2013.01); *H01L 27/323* (2013.01); *H01L 51/5203* (2013.01)

(58) Field of Classification Search
CPC .......................... H01L 27/3246; H01L 27/323
See application file for complete search history.

(56) References Cited

U.S. PATENT DOCUMENTS

| | | | | |
|---|---|---|---|---|
| 2016/0056413 A1* | 2/2016 | Hirosawa | ............ | H01L 51/5253 257/40 |
| 2016/0118449 A1* | 4/2016 | Sato | .................... | H01L 27/3246 257/89 |

FOREIGN PATENT DOCUMENTS

JP          2009-288956 A      12/2009

\* cited by examiner

*Primary Examiner* — Timor Karimy
(74) *Attorney, Agent, or Firm* — Typha IP LLC

(57) ABSTRACT

A display device includes a plurality of pixel electrodes including a first pixel electrode, a first electrode adjacent to the first pixel electrode and arranged separated from the first pixel electrode, a bank covering an edge part of the first pixel electrode, an end part of the first electrode, and a region between the first pixel electrode and the first electrode, a first organic layer arranged above the first pixel electrode, above the first electrode and above the bank, a second organic layer arranged above the first organic layer overlapping the first pixel electrode, a third organic layer arranged above the second organic layer, above the first organic layer overlapping the first electrode, and above the first organic layer overlapping the bank, an opposing electrode arranged above the third organic layer overlapping the first pixel electrode, and a second electrode arranged above the third organic layer overlapping the first electrode.

11 Claims, 14 Drawing Sheets

A

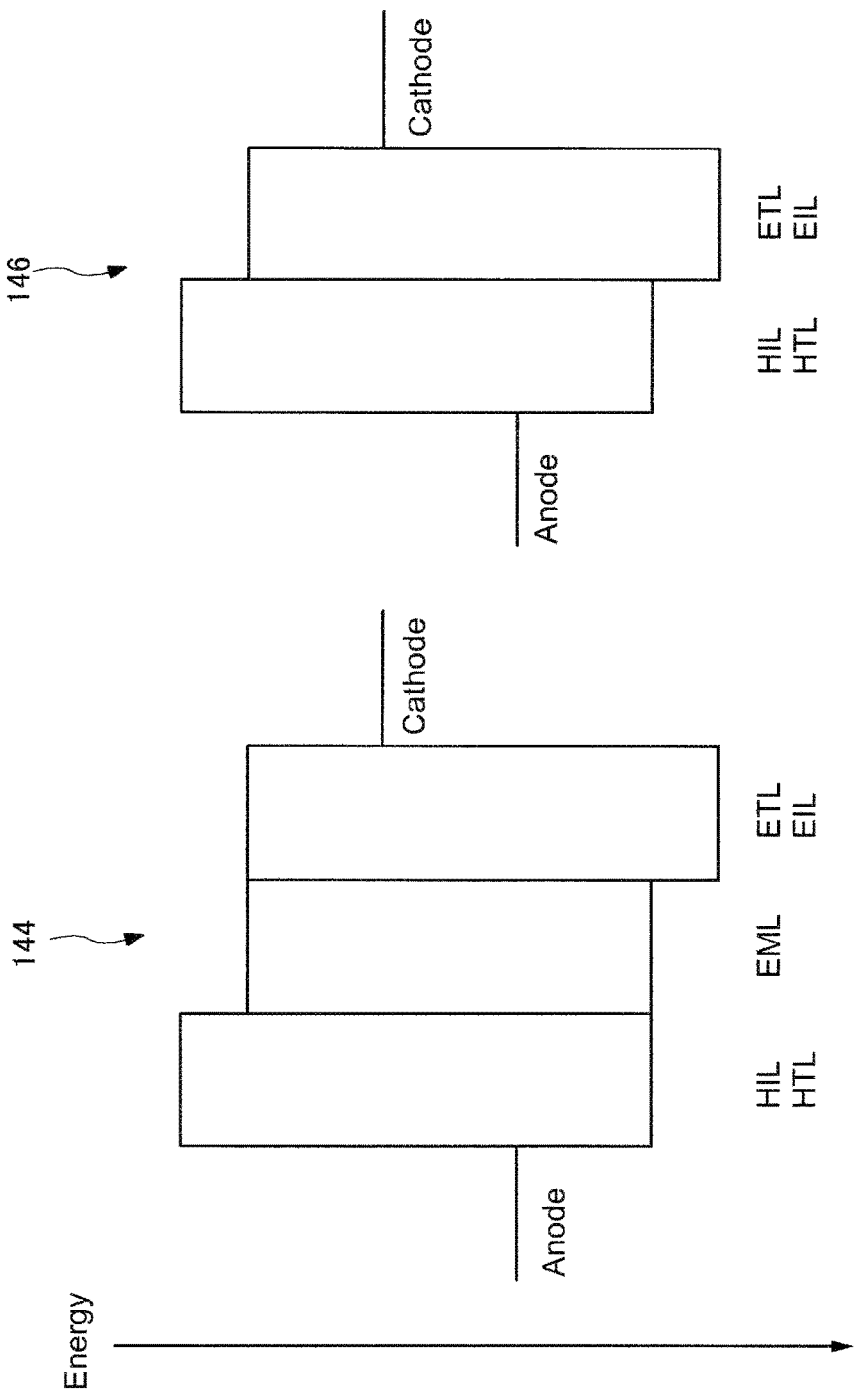

DISPLAY DEVICE

CROSS-REFERENCE TO RELATED APPLICATIONS

This application is based upon and claims the benefit of priority from the prior Japanese Patent Application No. 2016-097999, filed on May 16, 2016, the entire contents of which are incorporated herein by reference.

FIELD

The present invention is related to a display device.

BACKGROUND

An organic electroluminescence (referred to herein as organic EL) display device includes a light emitting element corresponding to each pixel and displays an image by individually controlling emitted light. A light emitting element includes an anode electrode, a cathode electrode and a layer (referred to herein as "light emitting layer") including an organic EL material sandwiched between the anode electrode and the cathode electrode. When electrons from the cathode and holes from the anode are injected into the light emitting layer, the electrons and holes recombine, light emitting molecules included in the light emitting layer are excited by surplus energy discharged by the recombination, and light is emitted by de-excitation.

In an organic EL display device, the anode in each light emitting element is arranged as a pixel electrode for each pixel and the cathode is arranged as a common electrode which bridges a plurality of pixels and is applied with a common voltage. The organic EL display device controls the light emitted by a pixel by applying a voltage of the pixel electrode to each pixel with respect to the voltage of the common electrode.

In recent years, technology for arranging a touch sensor for performing touch detection by detecting light is developing in organic EL display devices. In such a touch sensor, when a display screen is touched by an object for providing instructions (instruction object), light which is scattered by the object is received by a photo-diode arranged on the interior of the organic EL display device and thereby detection of the touch position is performed.

For example, an organic EL display device is disclosed in Japanese Laid Open Patent Publication No. 2009-288956 in which an organic light emitting element including a light emitting element capable of emitting infrared light and an infrared light sensor are arranged above a substrate. According to this structure, it is possible emit infrared light while displaying an image. When an instruction object is near or contacts a display screen, intensity information of light irradiated from the instruction object is read using the infrared sensor and thereby position information of the instruction object is obtained.

However, in an organic EL display device arranged with a conventional touch sensor, it is necessary to add a process for forming a photo-diode.

SUMMARY

A display device related to one embodiment of the present invention includes a plurality of pixel electrodes including a first pixel electrode, a first electrode adjacent to the first pixel electrode and arranged separated from the first pixel electrode, a bank covering an edge part of the first pixel electrode, an end part of the first electrode, and a region between the first pixel electrode and the first electrode, a first organic layer arranged above the first pixel electrode, above the first electrode and above the bank, a second organic layer arranged above the first organic layer overlapping the first pixel electrode, a third organic layer arranged above the second organic layer, above the first organic layer overlapping the first electrode, and above the first organic layer overlapping the bank, an opposing electrode arranged above the third organic layer overlapping the first pixel electrode, and a second electrode arranged above the third organic layer overlapping the first electrode.

A display device related to one embodiment of the present invention includes a plurality of pixel electrodes including a first pixel electrode, a bank covering an edge part of the first pixel electrode, and a region between adjacent pixel electrodes, a first electrode arranged separated from the first pixel electrode and above the bank, a first organic layer arranged above the first pixel electrode, above the first electrode and above the bank, a second organic layer arranged above the first organic layer overlapping the first pixel electrode, a third organic layer arranged above the second organic layer, above the first organic layer overlapping the first electrode, and above the first organic layer overlapping the bank, an opposing electrode arranged above the third organic layer overlapping the first pixel electrode, and a second electrode arranged above the third organic layer overlapping the first electrode.

BRIEF DESCRIPTION OF DRAWINGS

FIG. 14 is a diagram for explaining an energy diagram of a light emitting element and a light receiving element.

DESCRIPTION OF EMBODIMENTS

Figure 1:
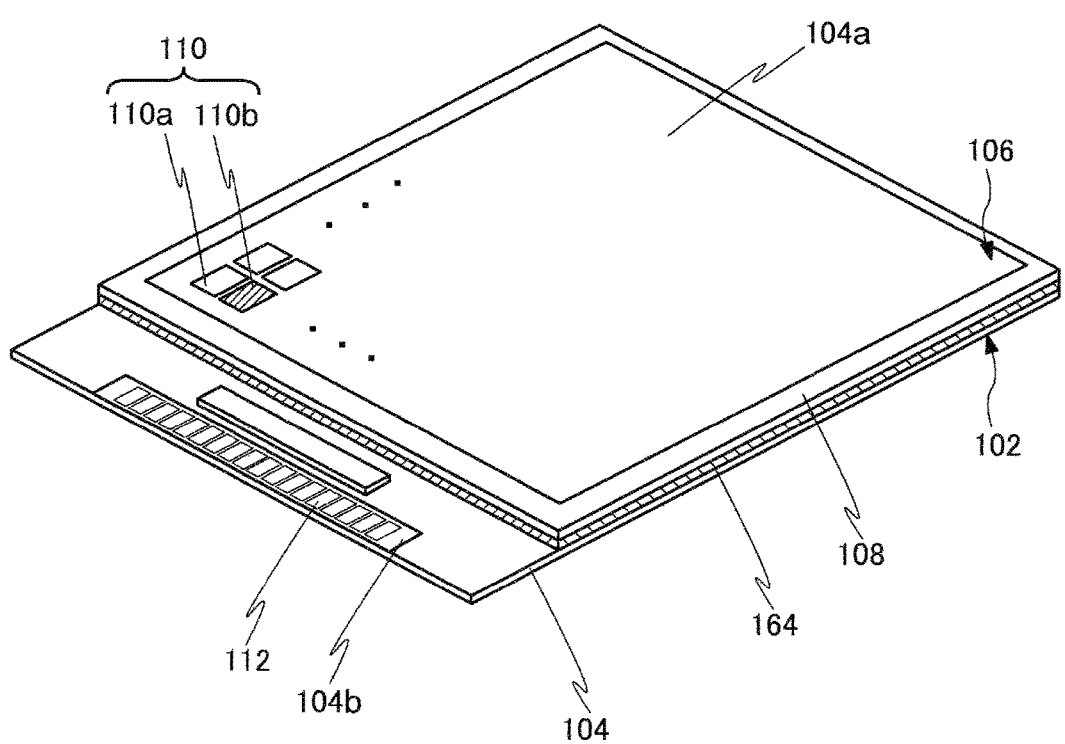
FIG. 1 is a perspective view diagram for explaining a schematic structure of a display device related to one embodiment of the present invention.

The display device related to a number of embodiments of the present invention is explained in detail below while referring to the diagrams. Furthermore, it is possible to perform the present invention using various different forms, and the display device of the present invention should not be limited to the embodiments herein. In all of the embodiments, the same reference symbols are attached to the same structural elements. In addition, the dimension ratios in the diagrams are different compared to actual ratios in order to better clarify explanation, and parts of the structure may be omitted from the diagrams.

Furthermore, in the present specification, expressions such "up" and "down" when explaining the diagrams express a relative positional relationship between structural elements which are the object of focus and other structural elements. In the present specification, a direction towards a semiconductor layer from an insulation surface described later is defined as "up" and the reverse direction is defined as "down". In the present specification and the scope of the patent claims, in the case of simply notating "above" when expressing the form of arranging other structural elements above a certain structural element, unless otherwise noted, this includes both the case of arranging other structural elements directly above so as to contact a certain structural element, and the case of arranging other structural elements above a certain structural element interposed by yet a separate structural element.

First Embodiment

The display device related to the present embodiment is explained while referring to the drawings. In particular, the structure of an external appearance of the display device, a circuit structure, a driving method and a pixel structure related to the present embodiment are explained.
[External Appearance Structure]

FIG. 1 is a perspective view diagram for explaining a structure of an external appearance of a display device 100 related to the present embodiment. The structure of an external appearance of the display device 100 related to the present embodiment is explained using FIG. 1.

The display device 100 related to the present embodiment includes an array substrate 102, an opposing substrate 106 and a plurality of connection terminals 112.

The array substrate 102 includes at least a first substrate 104 and a plurality of pixels 110.

The surface of the first substrate 104 includes a display region 104a and a terminal region 104b. The first substrate 104 plays the role of a support body of the plurality of pixels 110. It is possible to use a glass substrate, acrylic resin substrate, alumina substrate or polyimide substrate and the like as the material of the first substrate 104.

The plurality of pixels 110 is arranged within the display region 104a of the first substrate 104. In the present embodiment, the plurality of pixels 110 is arranged in a matrix shape. In the explanation herein, the plurality of pixels 110 is explained as being arranged in a matrix shape of m number of rows and n number of columns.

Each of the plurality of pixels 110 is classified into two types, a light emitting pixel 110a and a light receiving pixel 110b. The light emitting pixel 110a has a function for displaying an image and the light receiving pixel 110b has a function for detecting a touch position. Although not shown in FIG. 1, each of the plurality of light emitting pixels 110a includes a light emitting element. Although not shown in FIG. 1, each of the plurality of light receiving pixels 110b includes a light receiving element. A light receiving element detects a pair of carriers generated by incident light. The light receiving element is also sometimes called a photoelectric conversion element. Furthermore, in the case where the light emitting pixel 110a and light receiving pixel 110b are not distinguished, both are collectively referred to herein as "pixel 110"

There is no particular limitation to the number and layout of each of the light emitting pixels 110a and light receiving pixels 110b. From the view point of securing luminosity and uniformity of the display device 100, it is preferred that the number of light emitting pixels 110a is as large as possible and are uniformly distributed. In addition, from the view point of securing detection precision of a touch position, it is preferred that the number of light receiving pixels 110b is as large as possible and are uniformly distributed. However, the resolution for detecting a touch position may also be low compared to the resolution for displaying an image. As a result, the ratio of light receiving pixels 110b may be low compared to the ratio of light emitting pixels 110a.

The opposing substrate 106 includes a second substrate 108. A similar substrate as the first substrate 104 may be used for the second substrate 108. The second substrate 108 is arranged opposing the first substrate 104 on an upper surface of the display region 104a. The second substrate 108 is fixed to the first substrate 104 by a sealing material 112 which surrounds the display region 104a. The display region 104a arranged in the first substrate 104 is sealed by the second substrate 108 and a sealing material 164. Furthermore, although the display device 100 related to the present embodiment includes the second substrate 108 as mentioned previously, the display device 100 is not limited to plate shaped components, and may be replaced with a film base or sealing base coated with a resin and the like.

Although not shown in the diagram, the opposing substrate 106 may further include a color filter, a light shielding layer, a polarization plate and a phase plate. The color filter is arranged in a position opposing each of the plurality of light emitting pixels 110a. The light shielding layer (also called a black matrix) is arranged in a position which demarcates each of the plurality of pixels 110. The polarization plate and phase plate cover the plurality of pixels 110 and are arranged on the side of the opposing substrate 106. The polarization plate and phase plate are arranged in order to suppress degradation in visibility due to external light incident to the display device 100 being reflected by a pixel electrode.

The plurality of connection terminals 112 is arranged within the terminal region 104b. A plurality of terminal regions 104b is arranged on one edge part of the first substrate 104 and the outer side of the second substrate 108. A wiring substrate (not shown in the diagram) which connects devices which output a video signal or a power source and the like with the display device 100 is arranged in the plurality of connection terminals 112. A connection point between the wiring substrate and the plurality of connection terminals 112 is exposed to the exterior.

A structure of the external appearance of the display device 100 related to the present embodiment was explained above. Next, a circuit structure of the display device 100 related to the present embodiment is explained while referring to the diagrams.

[Circuit Structure]

Figure 2:
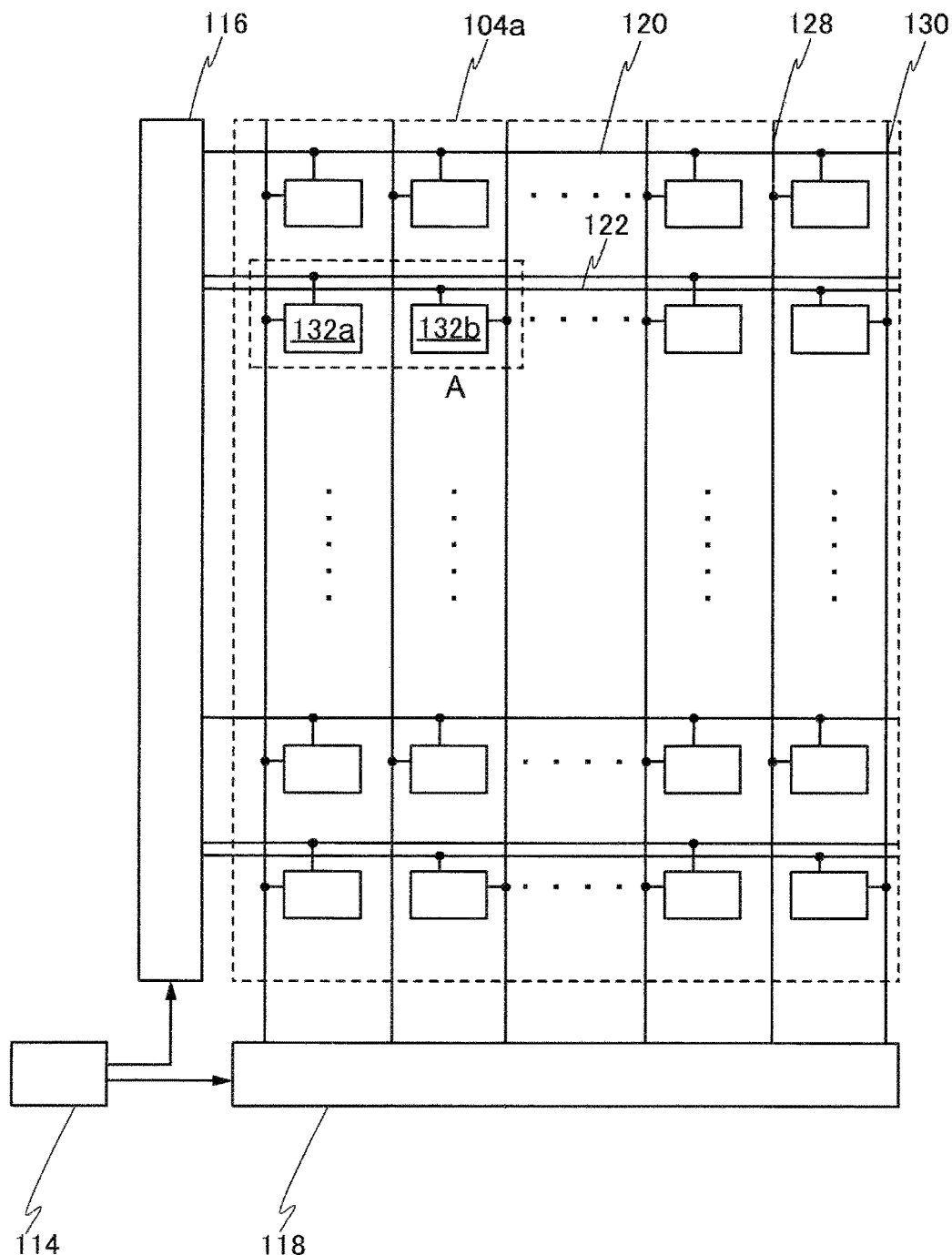
FIG. 2 is a circuit diagram for explaining a circuit structure of a display device related to one embodiment of the present invention.
Figure 3:
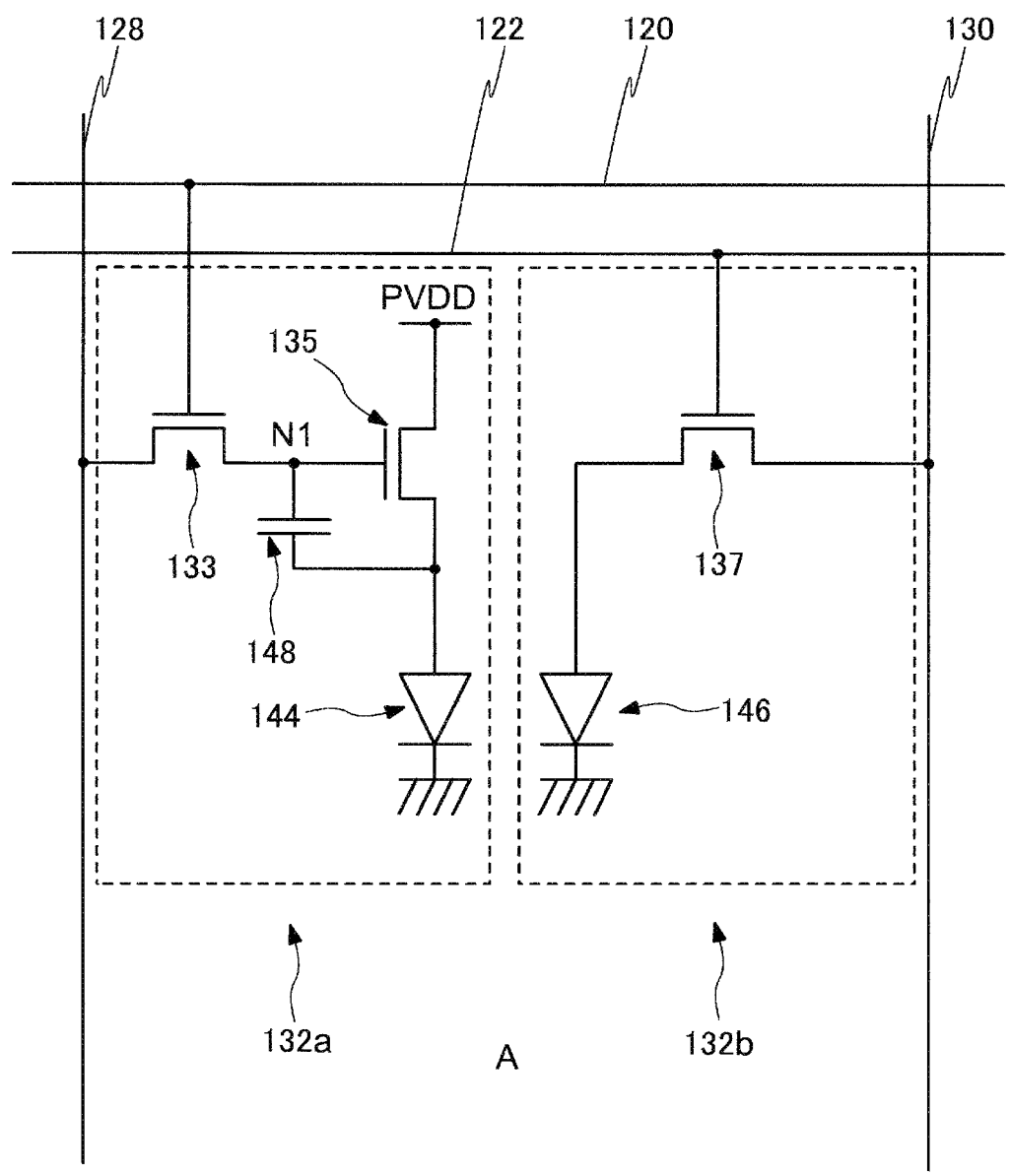
FIG. 3 is a circuit diagram for explaining a circuit structure of a pixel included in a display device related to one embodiment of the present invention.

FIG. 2 is a circuit diagram for explaining a circuit structure of the display device 100 related to the present embodiment. FIG. 3 is a circuit diagram for explaining a circuit structure of a pixel 110 included in the display device 100 related to the present embodiment. A circuit arranged in an adjacent light emitting pixel 110*a* and light receiving pixel 110*b* shown in the region A in FIG. 2 is shown in FIG. 3.

The display device 100 related to the present embodiment is arranged with a drive circuit, a plurality of first scanning signal lines 120, a plurality of second scanning signal lines 122, a plurality of video signal lines 128, a plurality of detection signal lines 130 and a plurality of pixel circuits 132 (light emitting pixel circuit 132*a* and light receiving pixel circuit 132*b*).

In the case where the light emitting pixel circuit 132*a* and light receiving pixel circuit 132*b* are not distinguished, they are collectively called a "pixel circuit 132" herein.

The drive circuit includes a control circuit 114, a scanning line drive circuit 116 and a video line/detection line drive circuit 118. The drive circuit drives a pixel circuit 132 arranged in each of the plurality of pixels 110. That is, the drive circuit controls light emitted by the plurality of light emitting pixels 110*a* and detects light received by the plurality of light receiving pixels 110*b*.

The control circuit 114 controls the operation of the scanning line drive circuit 116 and video line/detection line drive circuit 118. The scanning line drive circuit 116 is connected to the plurality of first scanning signal lines 120 and plurality of second scanning signal lines 122. The video line/detection line drive circuit 118 is connected to the plurality of video signal lines 128 and a plurality of signal detection lines.

The first scanning signal line 120 is arranged corresponding to each row (pixel row) of the plurality of pixels 110 arranged in a matrix shape. However, in the case where only a light receiving pixel 110*b* is arranged and no light emitting pixel 110*a* is arranged in one pixel row, the first scanning signal line 120 may not be arranged in that pixel row.

The second scanning signal line 122 is arranged corresponding to each row (pixel row) of the plurality of pixels 110 arranged in a matrix shape. However, in the case where only a light emitting pixel 110*a* is arranged and no light receiving pixel 110*b* is arranged in one pixel row, the second scanning signal line 122 may not be arranged in that pixel row.

The video signal line 128 is arranged corresponding to each column (pixel column) of the plurality of pixels 110 arranged in a matrix shape. However, in the case where only a light receiving pixel 110*b* is arranged and no light emitting pixel 110*a* is arranged in one pixel column, the video signal line 128 may not be arranged in that pixel column.

The signal detection line 130 is arranged corresponding to each column (pixel column) of the plurality of pixels 110 arranged in a matrix shape. However, in the case where only a light emitting pixel 110*a* is arranged and no light receiving pixel 110*b* is arranged in one pixel column, the signal detection line 130 may not be arranged in that pixel column.

As described above, a pixel circuit 132 is arranged corresponding to each of the plurality of pixels 110. A pixel circuit 132 is classified into two types, a light emitting pixel circuit 132*a* and light receiving pixel circuit 132*b*.

The light emitting pixel circuit 132*a* is arranged in each of the plurality of light emitting pixels 110*a* and is connected to any of the plurality of first scanning signal lines 120 and any of the plurality of video signal lines 128. The light emitting pixel circuit 132*a* includes at least a first transistor 133, a second transistor 135, a light emitting element 144 and a storage capacitor 148.

The first transistor 133 functions as a so-called selection transistor. That is, the first transistor 133 controls the conductive state between a video signal line 128 and the gate of the second transistor 135 by an ON/OFF operation. The first transistor 133 includes a gate connected to a first scanning signal line 120, a source connected to a video signal line 128, and a drain connected to a first node N1.

The second transistor 135 functions as a so-called drive transistor. That is, the second transistor 135 is a transistor for controlling the luminosity of light emitted by the light emitting element 144. The second transistor 135 includes a gate connected to the first node N1, a source connected to a power supply voltage line PVDD, and a drain connected to an anode of the light emitting element 144.

One end of the storage capacitor 148 is connected to the first node N1, and the other end is connected to an anode of the light emitting element 144.

The light emitting element 144 includes an anode connected to the drain of the second transistor 135 and the other end of the storage capacitor 148, and a cathode connected to a common voltage line.

A light receiving pixel circuit 132*b* is arranged in each of the plurality of light receiving pixels 110*b* and is connected to any of the plurality of second scanning signal lines 122 and any of the plurality of detection signal lines 130. The light receiving pixel circuit 132*b* includes at least a third transistor 137 and a light receiving element 146.

The third transistor 137 functions as a switch for detecting light reception. That is the third transistor 137 controls the conductive state between a detection signal line 130 and the anode of the light receiving element 146 by an ON/OFF operation. The third transistor 137 includes a gate connected to a second scanning signal line 122, a source connected to an anode of the light receiving element 146, and a drain connected to a detection signal line 130.

The light receiving element 146 includes an anode connected to the source of the third transistor 137 and a cathode connected to a common voltage line.

A circuit structure of the display device 100 related to the present embodiment was explained above. Next, a driving method of the display device 100 related to the present embodiment is explained while referring to the diagrams.

[Driving Method]

Figure 4:
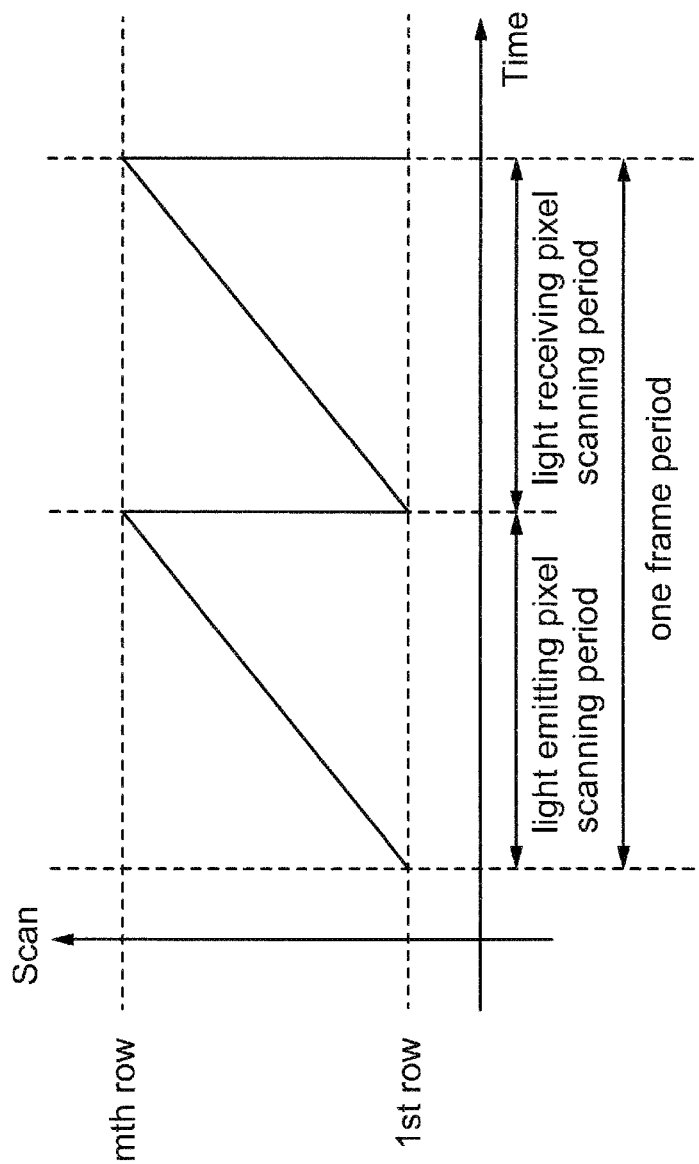
FIG. 4 is a diagram for explaining a driving method of a display device related to one embodiment of the present invention.

FIG. 4 is a diagram for explaining a driving method of the display device 100 related to the present embodiment. According to the driving method of the display device 100 related to the present embodiment, one frame period includes a light emitting pixel scanning period and a light receiving pixel scanning period.

A light emitting pixel scanning period is a period in which a signal corresponding to a display image is written to each of the plurality of light emitting pixels 110*a*. Specifically, the display device 100 performs the following operation in the light emitting pixel scanning period.

In the light emitting pixel scanning period, the scanning line drive circuit 116 selects in sequence a first scanning signal line 120 connected to each of a plurality of pixel rows corresponding to a timing signal input from the control circuit 114, and applies a voltage for turning ON a first transistor 133 included in a light emitting pixel circuit 132a connected to the selected first scanning signal line 120.

In the light emitting pixel scanning period, the video line/detection line drive circuit 118 is input with a video signal from the control circuit 114, and outputs a voltage corresponding to the video signal of a selected pixel row to each of the plurality of video signal lines 128 in synchronization with the selection of the first scanning signal line 120 by the scanning line drive circuit 116. This voltage is written to the storage capacitor 148 via the first transistor 133 at the selected pixel row. The second transistor 135 supplies a current corresponding to the written voltage to the light emitting element 144. In this way, the light emitting element 144 of a light emitting pixel 110a corresponding to the selected first scanning signal line 120 emits light.

A light receiving pixel scanning period is a period for detecting whether each of the plurality of light receiving pixels 110b has received light in the light emitting pixel scanning period. In the light receiving pixel scanning period, when light emitted by a light emitting pixel 110a is scattered by an object such as a finger that touches the display region 104a, the scattered light is received by a light receiving pixel 110b arranged near the light emitting pixel 110a. A carrier pair is generated as a result and accumulates within the light receiving element 146. By detecting this carrier pair in a light receiving pixel scanning period, it is possible to detect a touch position. Specifically, the display device 100 performs the following operation in the light receiving pixel scanning period.

In a light receiving pixel scanning period, the scanning line drive circuit 116 selects in sequence each of a plurality of pixel rows corresponding to a timing signal input from the control circuit 114. At this time, the scanning line drive circuit 116 outputs a voltage for turning ON the third transistor 137 to a second scanning signal 122 connected to a pixel 110 on the pixel row.

In the light receiving pixel scanning period, the video line/detection line drive circuit 118 outputs a constant voltage to each of a plurality of signal detection lines in synchronization with the selection of a pixel row by the scanning line drive circuit 116. The constant voltage is applied to one end of a light receiving element 146 via the third transistor 137 at a selected pixel row. At this time, in the case where a carrier pair accumulates within the light receiving element 146, a positive charge among the pair flows into a detection signal line 130, and the accumulated charge is read out by the video line/detection line drive circuit 118. In this way, it is possible to detect a touch position.

A driving method of the display device 100 related to the present embodiment was explained above. Next, a detailed structure of a pixel 110 included in the display device 100 related to the present embodiment is explained.

[Pixel Structure]

Figure 5:
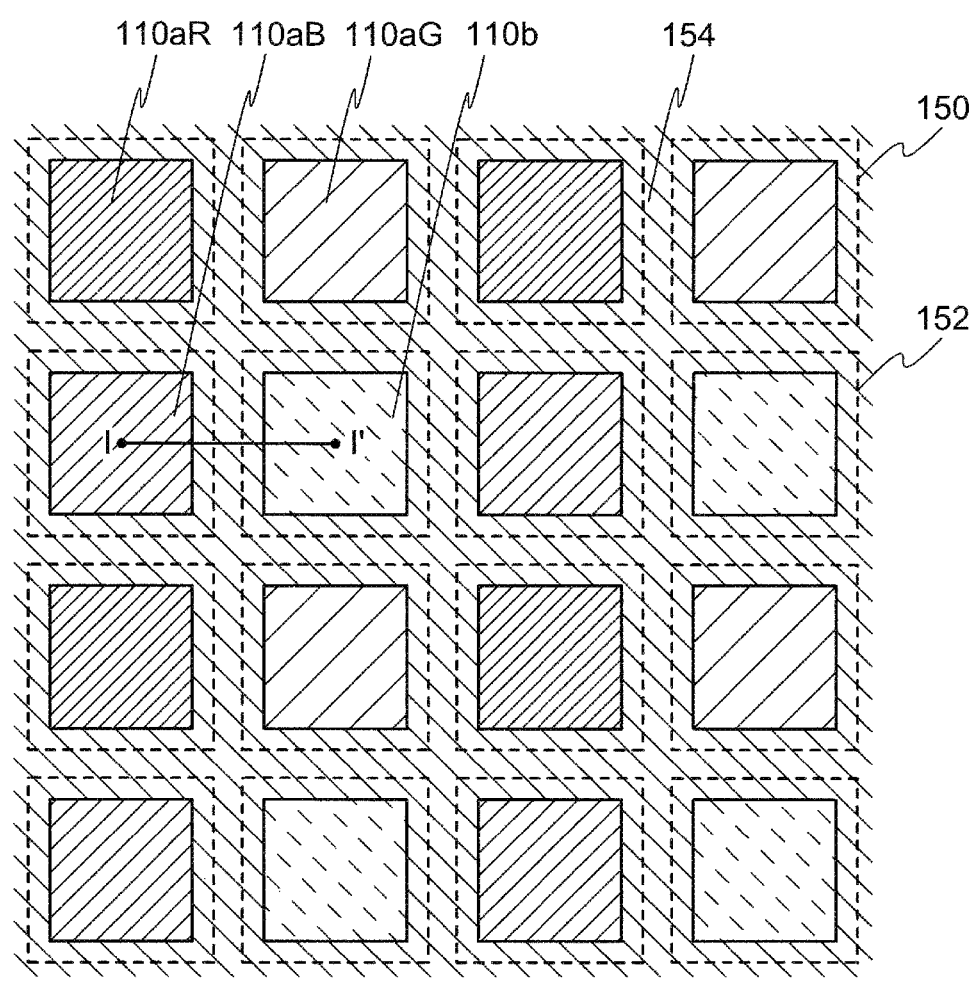
FIG. 5 is a planar view diagram for explaining a pixel layout included in a display device related to one embodiment of the present invention.
Figure 6:
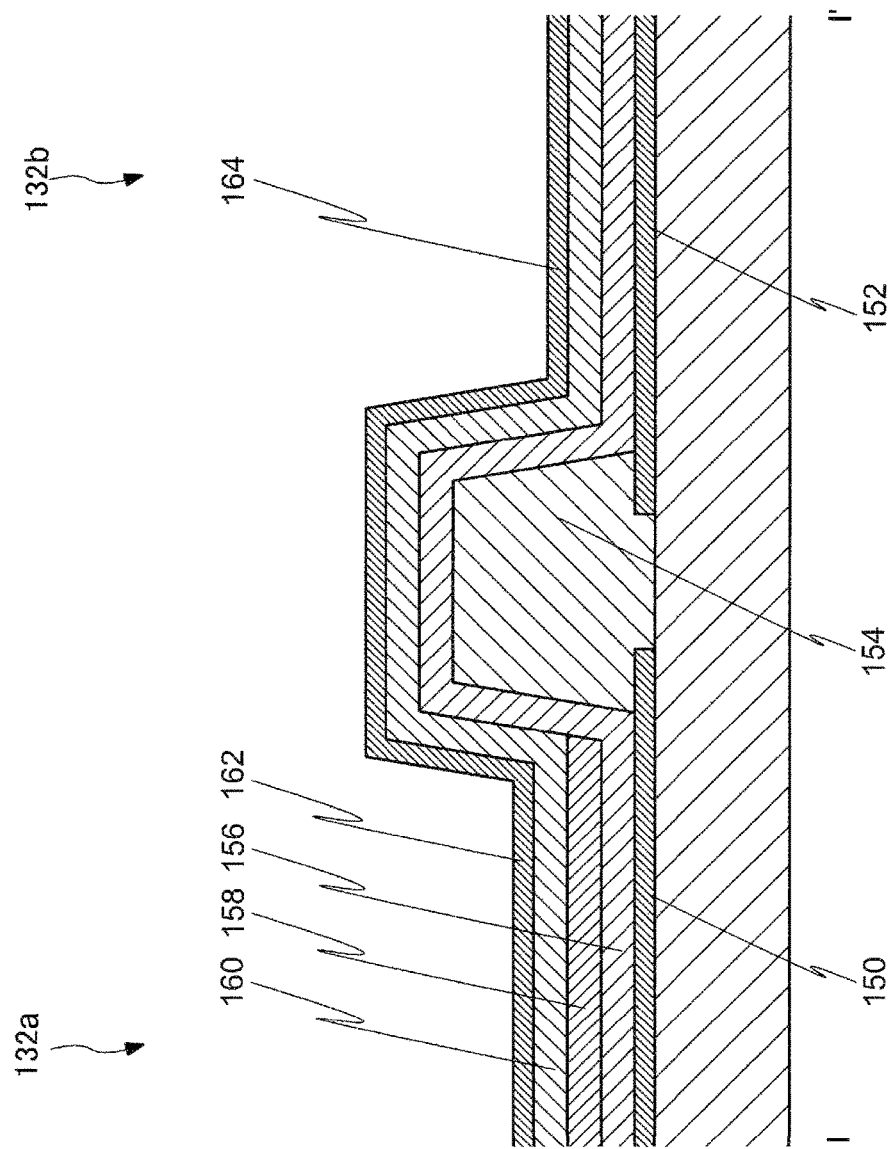
FIG. 6 is a cross-sectional diagram for explaining a pixel structure included in a display device related to one embodiment of the present invention.

FIG. 5 is a planar view diagram for explaining a layout of a pixel 110 included in the display device 100 related to the present embodiment. FIG. 6 is a cross-sectional diagram (corresponding to the line I-I' shown in FIG. 5) for explaining a structure of a pixel 110 included in the display device 100 related to the present embodiment. FIG. 14 is a diagram for explaining an energy diagram in a layer structure of a light emitting element 144 and a light receiving element 146.

The display device 100 related to the present embodiment is arranged with a plurality of pixel electrodes 150, a plurality of first electrodes 152, a bank 154, a first organic layer 156, a second organic layer 158, a third organic layer 160, an opposing electrode 162 and a second electrode 164.

In FIG. 5, a pixel electrode 150 is arranged in a red light emitting pixel 110aR, green light emitting pixel 110aG and blue light emitting pixel 110aB among a plurality of pixels 110 arranged in a matrix shape. The pixel electrode 150 is a layer which functions as an anode of a light emitting element 144. The first electrode 152 is arranged in a light receiving pixel 110b. In the present embodiment, the plurality of pixels 110 arranged in a matrix shape is arranged so that four pixels arranged in two rows and two columns is defined as one unit and each unit pixel group is further arranged in a matrix shape. In FIG. 5, the dotted line on the circumference of each pixel 110 shows a pixel electrode 150 or first electrode 152. In addition, the periphery edge part of each pixel is an edge part of the bank 154. Furthermore, although the pixel electrode 150 and first electrode 152 include a pixel circuit and contact part arranged on lower layers thereof, these are omitted from the diagram. The four pixels 110 arranged in two rows and two columns include a red light emitting pixel 110aR, green light emitting pixel 110aG, blue light emitting pixel 110aB and a light receiving pixel 110b. The plurality of pixel electrodes 150 are arranged in the red light emitting pixel 110aR, green light emitting pixel 110aG and blue light emitting pixel 110aB.

It is preferred to include a metal layer with high reflectance as the material of the pixel electrode 150 in order to reflect light emitted by a light emitting element 144 to the opposing electrode 162 side. It is possible to use silver (Ag) for example as the metal layer with high reflectance.

The first electrode 152 is arranged adjacent to the pixel electrode 150 and is separated from each of the pixel electrodes 150. The first electrode 152 is a layer which functions as an anode of the light receiving element 146. In the present embodiment, the first electrode 152 is arranged adjacent to a pixel electrode 150 arranged in a blue light emitting pixel 110aB in a row direction, and is arranged separated from a pixel electrode 150 arranged in a blue light emitting pixel 110aB. In addition, the first electrode 152 is arranged adjacent to a pixel electrode 150 arranged in a green light emitting pixel 110aG in a column direction, and is arranged separated from a pixel electrode 150 arranged in a green light emitting pixel 110aG.

It is possible to use the same material as the material of the pixel electrode 150 mentioned above as the material of the first electrode 152.

In FIG. 6, the bank 154 is formed so as to cover an edge part of each of the plurality of pixel electrodes 150, an edge part of each of the plurality of first electrodes 152, and a region (gap part) between a pixel electrode 150 and first electrode 152. It is preferred to use an insulation material as the material of the bank 154. It is possible to use an inorganic insulation material or an organic insulation material as the insulation material. A combination of an inorganic insulation material and an organic insulation material may also be used.

By arranging the bank 154 formed by an insulation material, it is possible to prevent short circuits between the opposing electrode 162 and a pixel electrode 150 at the edge part of the pixel electrode 150. Furthermore, it is possible to reliably insulate adjacent pixels 110.

The first organic layer 156 is an organic layer which functions as either or both a hole injection layer and hole transport layer. The first organic layer 156 is arranged continuously above the plurality of pixel electrodes 150, the plurality of first electrodes 152 and the bank 154. The first organic layer 156 may also be arranged for example across the display region 104a in common with the plurality of pixels 110 (including the light emitting pixel 110a and light receiving pixel 110b). Furthermore, it is not always necessary for the first organic layer 156 to be arranged continuously.

The second organic layer 158 is an organic layer which functions as a light emitting layer which emits light when supplied with a current. The second organic layer 158 is arranged above the first organic layer 156 in a region at least overlapping the plurality of pixel electrodes 150. The second organic layer 158 does not have to be arranged on a region overlapping the plurality of first electrodes 152. For example, the second organic layer 158 may be arranged continuously including a region overlapping the plurality of pixel electrodes 150 and may also include an opening part in a region overlapping the plurality of first electrodes 152.

The third organic layer 160 is an organic layer which functions as either or both an electron injection layer and electron transport layer. The third organic layer 160 is arranged continuously above the second organic layer 158, above the first organic layer 156 overlapping the first electrode 152 and above the first organic layer 156 overlapping the bank 154. The third organic layer 160 may also be arranged for example across the display region 104a in common with a plurality of pixels 110 (including the light emitting pixel 110a and light receiving pixel 110b). Furthermore, it is not always necessary for the third organic layer 160 to be arranged continuously.

The opposing electrode 162 is arranged above the third organic layer 160 overlapping the plurality of pixel electrodes 150. The opposing electrode 162 is a layer which functions as a cathode of the light emitting element 144.

A material having translucency and conductivity is preferred as the material of the opposing electrode 162 in order to allow light emitted by the light emitting element 144 to pass through and to irradiate light to the light receiving element 146. Specifically, ITO (indium oxide doped with tin oxide) or IZO (indium oxide, zinc oxide) and the like are preferred as the material of the opposing electrode 162. Alternatively, a metal layer having a film thickness sufficient to allow emitted light to pass through may also be used as the opposing electrode 162.

The second electrode 164 is arranged above the third organic layer 160 overlapping the first electrode 152. The second electrode 164 is a layer which functions as the cathode of the light receiving element 146. It is possible to use the same material as the material of the opposing electrode 162 mentioned above as the material of the second electrode 164.

The opposing electrode 162 and second electrode 164 may also be electrically connected as in the present embodiment. In the present embodiment, an electrode arranged in common across the display region 104a serves as both the opposing electrode 162 and second electrode 164. In this case, a common voltage is provided to the cathode of the light emitting element 144 and light receiving element 146 in the pixel circuit 132 shown in FIG. 3.

As explained above, the light emitting element 144 is formed by stacking the pixel electrode 150, first organic layer 156, second organic layer 158, third organic layer 160 and opposing electrode 162. That is, a region stacked with these layers and electrodes corresponds to a region of the light emitting element 144. The light receiving element 146 is formed by stacking the first electrode 152, first organic layer 156, third organic layer 160 and second electrode 164. The light emitting element 144 and light receiving element 146 both include diode properties.

The layer structure of the light emitting element 144 and light receiving element 146 includes an energy band structure approximately shown in FIG. 14. FIG. 14 schematically shows an energy gap of the first organic layer 156, second organic layer 158 and third organic layer 160, and a conduction band edge part of an anode and cathode.

The light receiving element 146 does not include a second organic layer 158 which functions as a light emitting layer (EML) and the first organic layer 156 and third organic layer 160 are in contact. When the light receiving element 146 includes a second organic layer 158, light-excitons generated by absorbed light are not separated to a charge which leads to a drop in efficiency (drop in signal strength) in the light receiving element 146. In the case of a material with a low dielectric constant such as an organic semiconductor, in order to efficiently separate excitons generated within the material to a charge, a charge separation utilizing a different type of material interface with a different highest occupied molecular orbital (HOMO) and lowest unoccupied molecular orbital (LUMO) is used. Considering a HOMO/LUMO level, it is not preferred that the second organic layer 158 is inserted into the light receiving element 146.

The HOMO and LUMO of each of the first organic layer 156 and third organic layer 160 are preferred to be as large as possible. When they are too small, a drop in efficiency (drop in signal strength) in a light receiving element is possible. Since a HOMO gap in the first organic layer 156 and a LUMO gap in the third organic layer 160 correspond to the size of an open end voltage of a light receiving element 146, a small gap leads to a drop in efficiency in the light receiving element 146.

Here, the preferred material of each organic layer is explained. Therefore, first an approximate explanation of the flow for detecting a touch position is provided. (1) In the light emitting element 144, the second organic layer 158 which functions as a light emitting layer emits light. (2) Light emitted by the second organic layer 158 is scattered by an object such as a finger which touches the display device 100. (3) The scattered light enters the light receiving element 146 arranged in the vicinity of the light emitting element 144. (4) Light which enters the light receiving element is converted to an electrical signal by the generation of a carrier pair within the light receiving element 146. (5) The touch position is detected by detecting the electrical signal.

Here, in order for the light receiving element 146 to detect light emitted from the light emitting element 144, it is necessary that a light emitting spectrum of the light emitting element 144 and an absorption spectrum of the light receiving element 146 overlap in at least a part of a wavelength region. At least one of the first organic layer 156 and the second organic layer 158 in the light receiving element 146 may be configured to function as a light absorption layer. In the case where one layer is set as a light absorption layer, the other layer does not have to be a light absorption layer.

In the case where the first organic layer 156 is set as a light absorption layer, it is possible to use a material including metal phthalocyanine or acene as a specific material of the first organic layer 156. By appropriately selecting a central metal included in phthalocyanine, it is possible to efficiently absorb a wavelength region of blue, green and near-infrared light.

In the case where the third organic layer 160 is set as a light absorption layer, it is possible to use a fullerene derivative and the like as a specific material of the third organic layer 160.

A structure of a pixel 110 included in the display device 100 related to the present embodiment was explained above. By adopting such a structure as described above, the display device 100 related to the present embodiment exhibits the following actions and effects.

In the display device 100 related to the present embodiment, the pixel electrode 150 and first electrode 152 can be arranged on the same layer. That is, in the manufacturing process, the pixel electrode 150 and first electrode 152 can be formed using the same material and at the same time by the same photolithography process.

Furthermore, the first organic layer 156 and third organic layer 160 are arranged in common in a light emitting element 144 and light receiving element 146. That is, in the manufacturing process, it is not necessary to pattern the first organic layer 156 and third organic layer 160. In addition, the second organic layer 158 is formed for example by vapor deposition through a mask so it is not arranged in a region overlapping the first electrode 152. The mask opens a region corresponding to at least the plurality of pixel electrodes 150. In addition, the mask shields a region corresponding to the first electrode 152.

Furthermore, it is possible to arrange the opposing electrode 162 and second electrode 164 in the same layer. That is, in the manufacturing process, the opposing electrode 162 and second electrode 164 can be formed using the same material and at the same time by the same photolithography process. In addition, it is possible to omit the photolithography process in the case of a circuit structure in which a voltage common to both is applied.

That is, in the display device 100 related to the present embodiment, it is possible to form the light emitting element 144 and light receiving element 146 within the display device 100 without significantly increasing the manufacturing process. Therefore, it is possible to provide the display device 100 arranged with a touch sensor for light detection at low cost.

Modified Example

A modified example of the display device 100 related to the present embodiment is explained.

Figure 7:
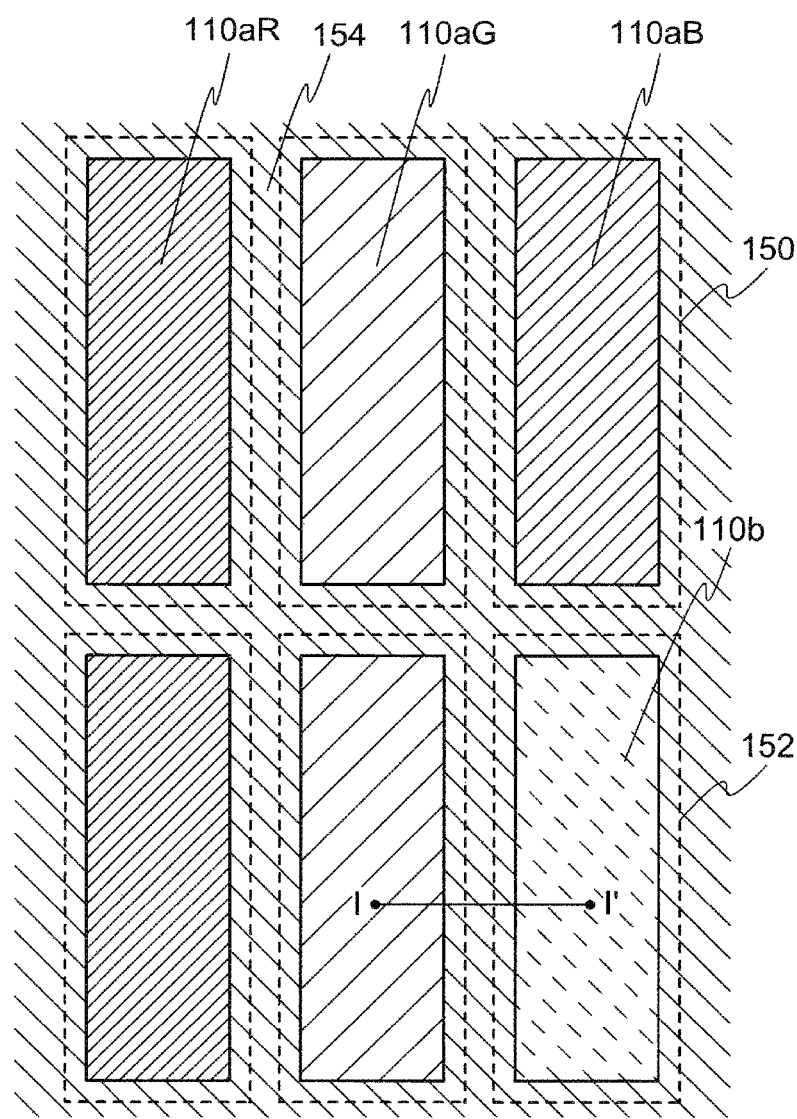
FIG. 7 is a planar view diagram for explaining a pixel layout included in a display device related to a modified example in one embodiment of the present invention.

FIG. 7 is a diagram for explaining a layout of the pixel 110 in a display device 190 related to the present modified example. The cross-structure between I-I' in FIG. 7 is the same as the cross-structure shown in FIG. 6. Comparing the display device 190 related to the present modified example and the display device 100 related to the present embodiment, only the layout of a plurality of pixels 110 is different. In the present modified example, the plurality of pixels 110 arranged in a matrix shape is arranged so that six pixels 110 arranged in two rows and three columns is defined as one unit and a pixel group of each unit is further arranged in a matrix shape. Six pixels 110 arranged in two rows and three columns include a red light emitting pixel 110aR, green light emitting pixel 110aG, blue light emitting pixel 110aB and light receiving pixel 110b. Among the six pixels 110 arranged in two rows and three columns, two pixels are red light emitting pixels 110aR, two pixels are green light emitting pixels 110aG, one pixel is a blue light emitting pixel 110aB and one pixel is a light receiving pixel 110b.

It this way, compared to the case where all of the colors are set to the same number of light emitting pixels, a part of a light emitting pixel 110a of a specific color may be thinned out and replaced with a light receiving pixel 110b. Furthermore, although a blue light emitting pixel 110aB is thinned out in the present embodiment, the present invention is not limited to a blue light emitting pixel 110aB and light emitting pixels 110a of other colors may also be thinned out. Furthermore, the layout and ratio between the plurality of light emitting pixels 110a and light receiving pixels 110b is not limited to this example. For example, in the present embodiment, one of six pixels 110 arranged in two rows and three columns is set as a light receiving pixel 110b. That is, in the present example, the ratio between a light emitting pixel 110a and light receiving pixel 110b is 5:1. However, if it is possible to obtain a minimum resolution for touch detection, the ratio of the light emitting pixels 110a may be further increased. For example, the ratio between the light emitting pixels 110a and light receiving pixels 110b may be around 10:1 or around 100:1.

In addition, a light receiving pixel 110b in the present embodiment is shown as being adjacent to a light emitting pixel 110a. That is, a pixel adjacent to an arbitrary light receiving pixel 110b in a row direction and a column direction is a light emitting pixel. However, the present invention is not limited to this layout. Two or more light receiving pixels 110b may also be arranged consecutively in a row direction and a column direction.

Second Embodiment

A structure of a display device related to the present embodiment is explained.

Figure 8:
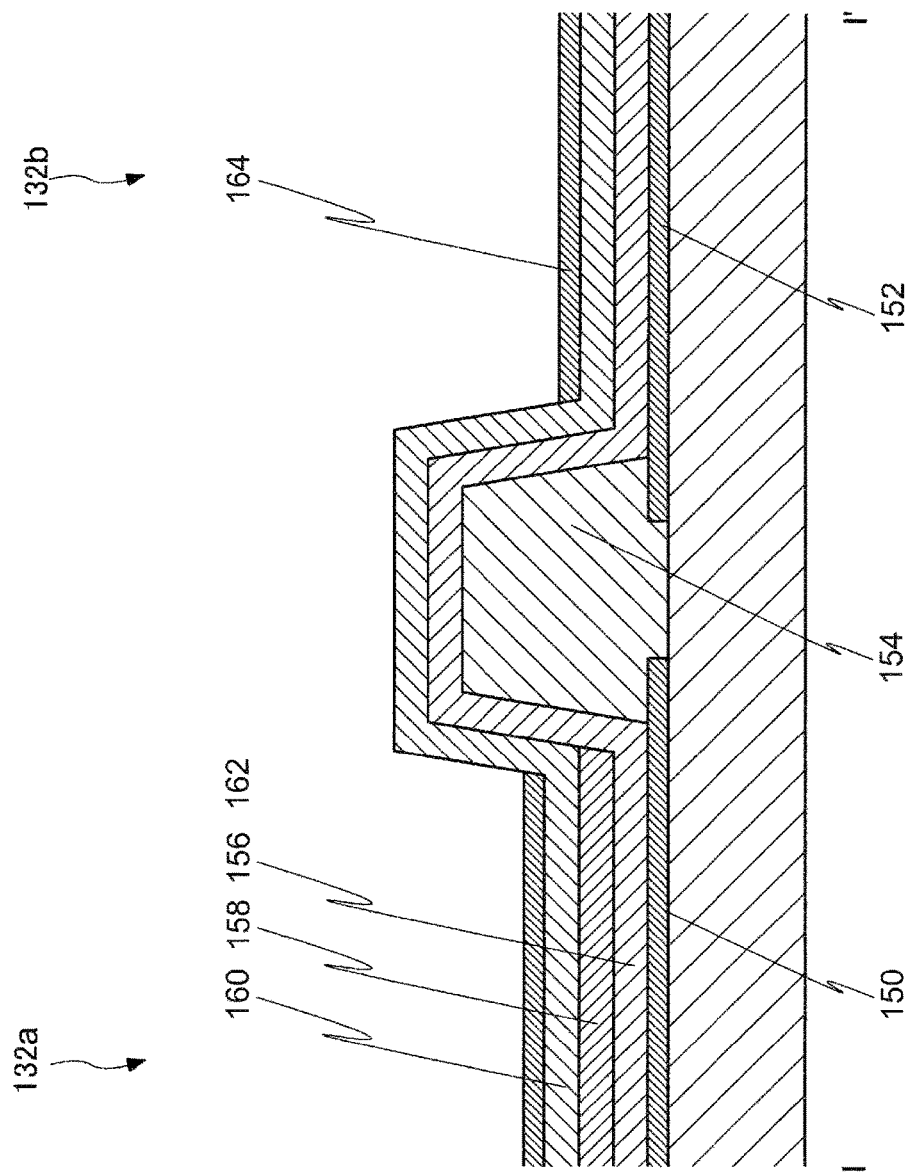
FIG. 8 is a cross-sectional diagram for explaining a pixel structure included in a display device related to one embodiment of the present invention.

FIG. 8 is a cross-sectional diagram for explaining a structure of a pixel 110 of a display device 200 related to the present embodiment. When the display device 200 related to the present embodiment is compared with the display device 100 related to the first embodiment, the structure of the opposing electrode 162 and the second electrode 164 is different. In the present embodiment, the opposing electrode 162 and the second electrode 164 are electrically separated. Specifically, the opposing electrode 162 and the second electrode 164 are separated along the bank 154 which demarcates a light emitting pixel 110a and light receiving pixel 110b.

By adopting such as structure, it is possible to supply different voltages to a cathode of the light emitting element 144 and cathode of the light receiving element 146. In this way, it is possible to supply an appropriate voltage to each of a cathode of the light emitting element 144 and a cathode of the light receiving element 146 and it is possible to drive a stable display device 200.

Third Embodiment

Figure 9:
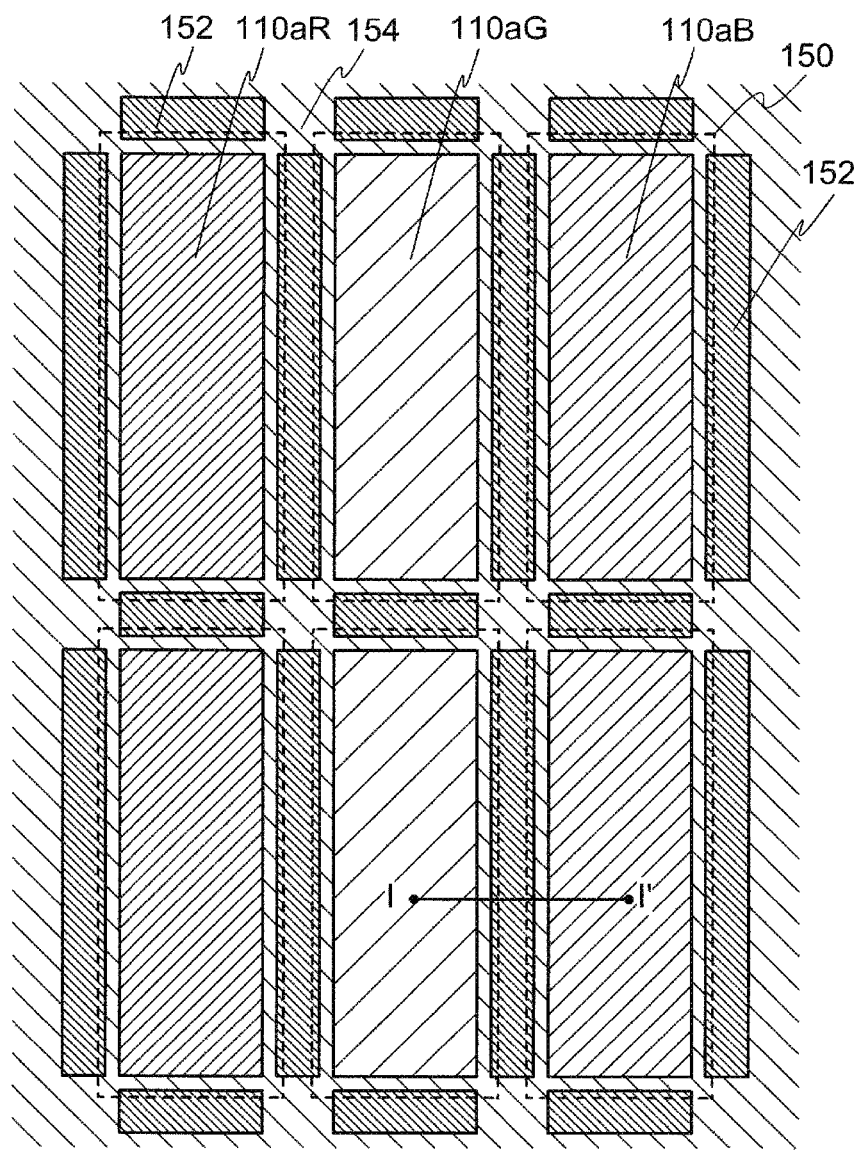
FIG. 9 is a planar view diagram for explaining a pixel layout included in a display device related to one embodiment of the present invention.
Figure 10:
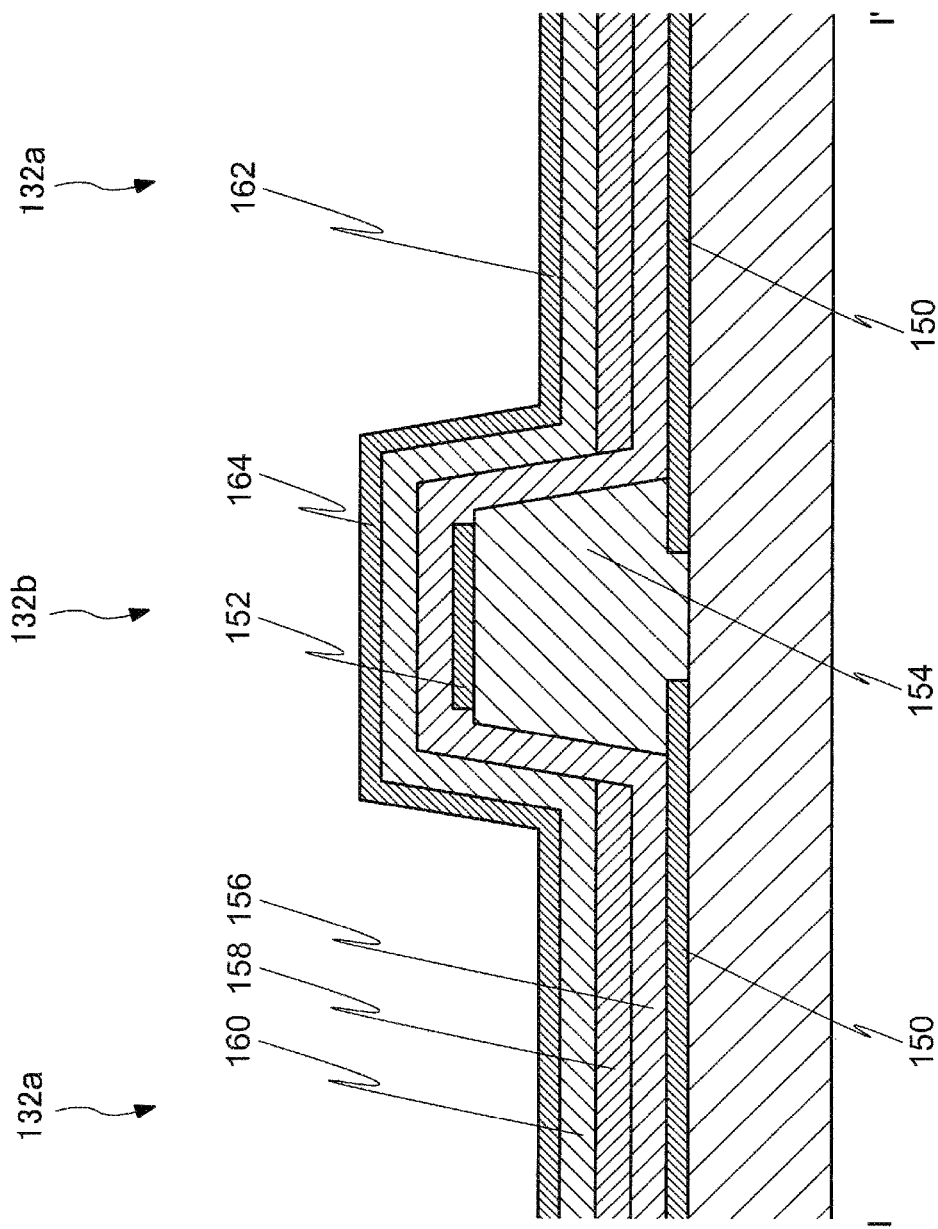
FIG. 10 is a cross-sectional diagram for explaining a pixel structure included in a display device related to one embodiment of the present invention.

FIG. 9 is a planar view diagram for explaining a layout of a pixel 110 in a display device 300 related to the present embodiment. FIG. 10 is a cross-sectional diagram (corresponding to the cross-sectional line I-I' shown in FIG. 9) for explaining a structure of a pixel 110 in a display device 300 related to the present embodiment. Comparing the display device 300 related to the present embodiment and the display device 100 related to the first embodiment, the structure of a light receiving pixel 110b and a layout of a light receiving pixel 110b of the display device 300 are different from those of the display device 100. An explanation of the structure common to the display device 100 related to the first embodiment is omitted below.

The display device 300 related to the present embodiment is arranged with a plurality of pixel electrodes 150, a bank 154, a plurality of first electrodes 152, a first organic layer 156, a second organic layer 158, a third organic layer 160, an opposing electrode 162 and a second electrode 164.

The plurality of pixel electrodes 150 is arranged in a matrix shape. In the present embodiment, a plurality of light emitting pixels 110a is arranged in a matrix shape and a pixel electrode 150 is arranged in each of the plurality of light emitting pixels 110a.

The bank 154 is formed so as to cover an edge part of each of the plurality of pixel electrodes 150 and a region (gap part) between adjacent pixel electrodes 150.

The plurality of first electrodes 152 is formed above the bank 154 and mutually separated from the plurality of pixel electrodes 150. The first electrode 152 is a layer which functions as an anode of a light receiving element 146.

In the present embodiment, the plurality of pixel electrodes 150 and plurality of first electrodes 152 include a region which overlaps via the bank 154 in a planar view.

The first organic layer 156 is continuously arranged above the plurality of pixel electrodes 150, above the first electrode 152 and above the bank 154. For example, the first organic layer 156 may also be arranged in common to the plurality of light emitting pixels 110a across a display region 104a. Furthermore, it is not always necessary that the first organic layer 156 is arranged continuously.

The second organic layer 158 is arranged in a region which is above the first organic layer 156 and overlaps the plurality of pixel electrodes 150.

The third organic layer 160 is continuously arranged above the second organic layer 158, above the first organic layer 156 overlapping the first electrode 152, and above the first organic layer 156 overlapping the bank 154. For example, the third organic layer 160 may be arranged in common to the plurality of light emitting pixels 110a across the display region 104a. Furthermore, it is not always necessary that the third organic layer 160 is arranged continuously.

The opposing electrode 162 is arranged opposing each of the plurality of pixel electrodes 150 above the third organic layer 160. In the present embodiment, the opposing electrode 162 is electrically connected to the plurality of pixels 110. That is, the opposing electrode 162 is extended across the plurality of pixels 110 continuously.

The second electrode 164 is arranged opposing each of the plurality of first electrodes 152 above the third organic layer 160.

The opposing electrode 162 and the second electrode 164 may be mutually electrically connected as in the present embodiment. In the present embodiment, the opposing electrode 162 and the second electrode 164 are formed by an electrode arranged in common across the display region 104a. In this case, in the pixel circuit 132 shown in FIG. 2, a common voltage is provided to the cathode of a light emitting element 144 and light receiving element 146.

As explained above, the light emitting element 144 is formed by stacking the pixel electrode 150, the first organic layer 156, the second organic layer 158, the third organic layer 160 and the opposing electrode 162. The light receiving element 146 is formed by stacking the first electrode 152, the first organic layer 156, the third organic layer 160 and the second electrode 164. Furthermore, the light receiving element 146 in the present embodiment is different to the display device 100 related to the first embodiment in that it is arranged above the bank 154.

By adopting such a structure, it is possible to suppress a drop in aperture ratio of the display device 300 and form a touch sensor.

Fourth Embodiment

A structure of a display device related to the present embodiment is explained.

Figure 11:
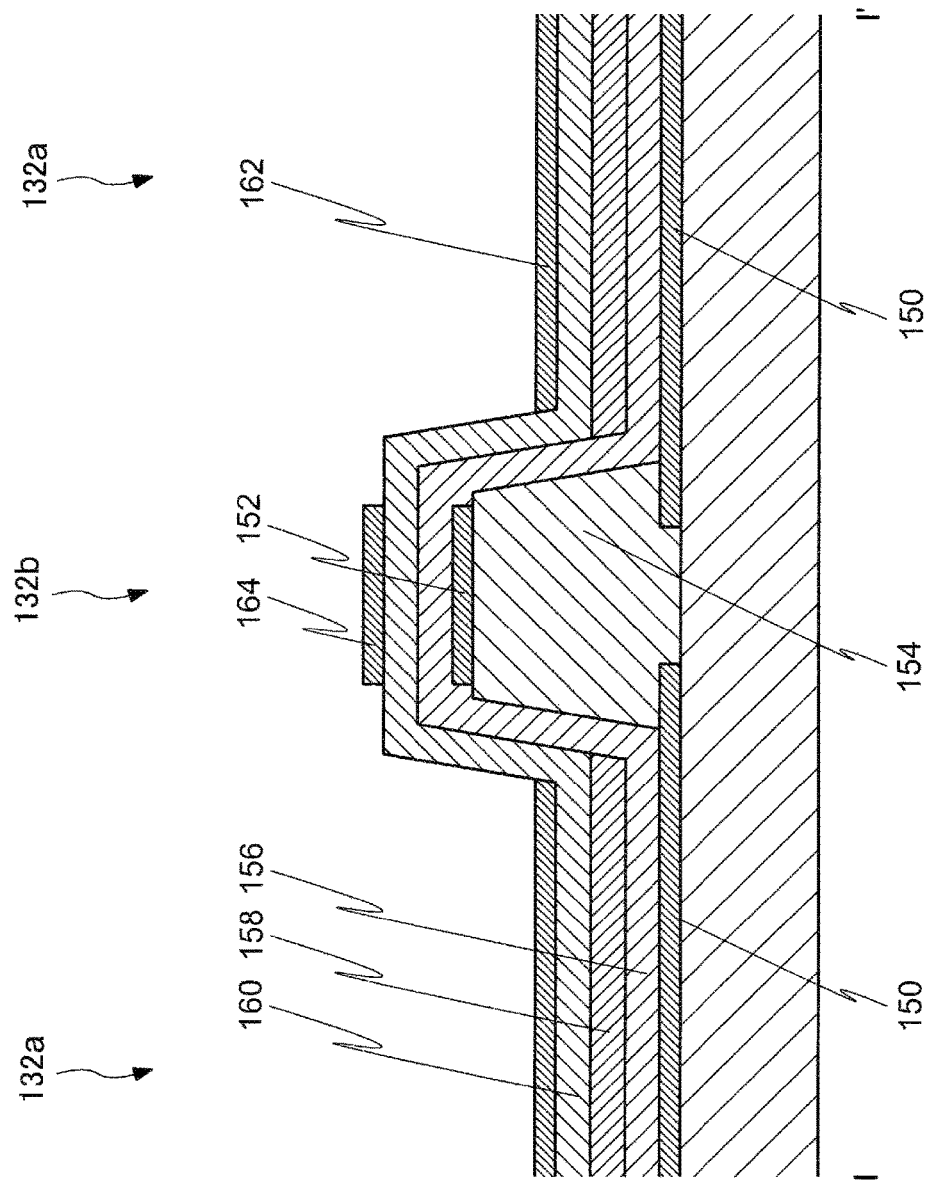
FIG. 11 is a cross-sectional diagram for explaining a pixel structure included in a display device related to one embodiment of the present invention.

FIG. 11 is a cross-sectional diagram for explaining a structure of a pixel 110 of a display device 400 related to the present embodiment. Comparing the display device 400 related to the present embodiment and the display device 300 related to the third embodiment, the structure of the opposing electrode 162 and the second electrode 164 of the display device 400 is different from those of the display device 300. In the present embodiment, the opposing electrode 162 and the second electrode 164 are electrically separated. Specifically, the opposing electrode 162 and the second electrode 164 are separated along the bank 154 which demarcates the light emitting element 110a and light receiving element 110b.

By adopting such as a structure, it is possible to supply different voltages to a cathode of the light emitting element 144 and cathode of the light receiving element 146. In this way, it is possible to supply an appropriate voltage to each of a cathode of the light emitting element 144 and a cathode of the light receiving element 146 and it is possible to drive a stable display device 400.

Fifth Embodiment

A display device related to the present embodiment is explained.

[Circuit Structure]

Figure 12:
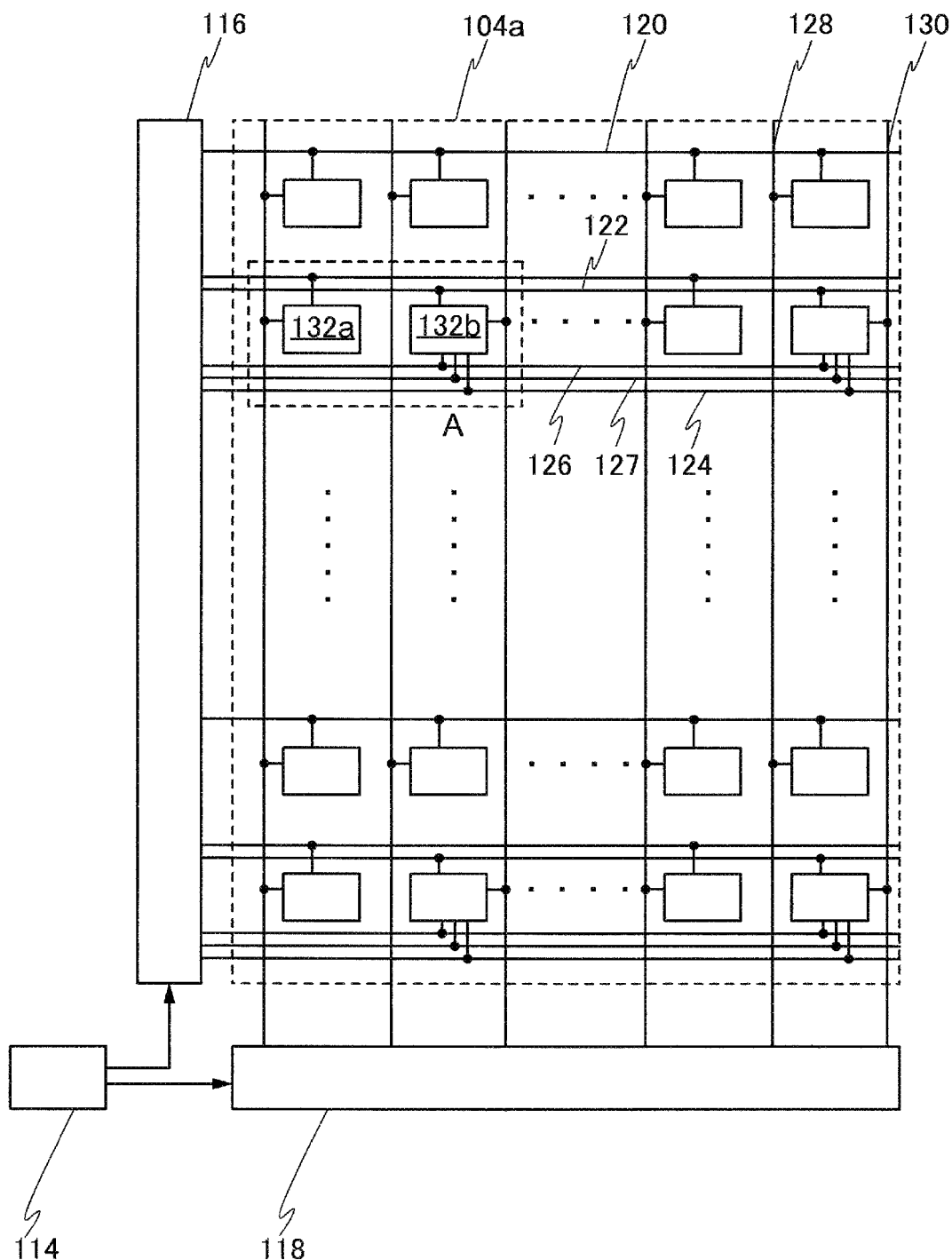
FIG. 12 is a circuit diagram for explaining a circuit structure of a display device related to one embodiment of the present invention.
Figure 13:
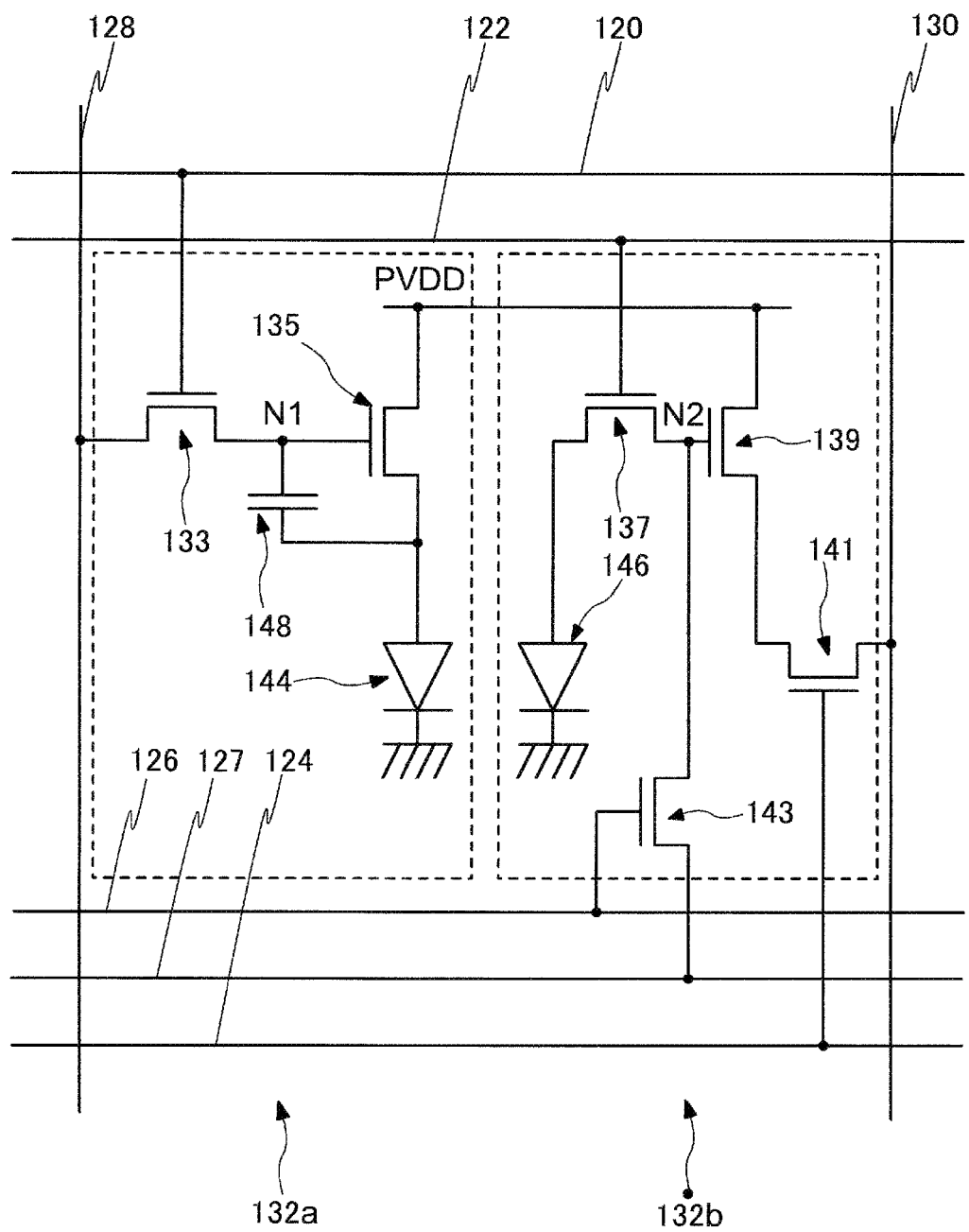
FIG. 13 is a circuit diagram for explaining a circuit structure of a pixel included in a display device related to one embodiment of the present invention.

FIG. 12 is a circuit diagram for explaining a circuit structure of a display device 500 related to the present embodiment. Comparing the display device 500 related to the present embodiment and the display device 100 related to the first embodiment, a structure and driving method of a pixel circuit 132 of the display device 500 are different from those of the display device 100. FIG. 13 is a cross-sectional diagram for explaining a circuit structure of a pixel 110 in the display device 500 related to the present embodiment. A circuit arranged in a light emitting pixel 110a and light receiving pixel 110b adjacent in the region A shown in FIG. 12 is shown in FIG. 13. A circuit structure and driving method of the display device 500 related to the present embodiment are explained below.

The display device 500 related to the present embodiment is arranged with a drive circuit, a plurality of first scanning signal lines 120, a plurality of second scanning signal lines 122, a plurality of third scanning signal lines 124, a plurality of fourth scanning signal lines 126, a plurality of video signal lines 128, a plurality of detection signal lines 130, a plurality or reset power supply lines 127 and a plurality of pixel circuits 132.

In this structure, since the pixel circuit, the plurality of first scanning signal lines 120, the plurality of second scanning signal lines 122, the plurality of video signal lines 128 and the plurality of detection signal lines 130 are the same as the structure explained in the display device 100 related to the first embodiment, an explanation is omitted here.

The plurality of third scanning signal lines 124 is arranged corresponding to each row (pixel row) of a plurality of pixels 110 arranged in a matrix shape. However, in the case where only a light emitting pixel 110a is arranged and a light receiving pixel 110b is not arranged in one pixel row, a third scanning signal line 124 may not be arranged in this pixel row.

The plurality of fourth scanning signal lines 126 is arranged corresponding to each row (pixel row) of a plurality of pixels 110 arranged in a matrix shape. However, in the case where only a light emitting pixel 110a is arranged and a light receiving pixel 110b is not arranged in one pixel row, a fourth scanning signal line 126 may not be arranged in this pixel row.

The plurality of reset power supply lines 127 is arranged corresponding to each row (pixel row) of a plurality of pixels 110 arranged in a matrix shape. However, in the case where only a light emitting pixel 110a is arranged and a light receiving pixel 110b is not arranged in one pixel row, a reset power supply line 127 may not be arranged in this pixel row.

The plurality of pixel circuits 132 is classified into two types, a light emitting pixel circuit 132a or light receiving pixel circuit 132b. Since only the structure of the light receiving pixel circuit 132b is different when compared to the display device 100 related to the first embodiment, an explanation of the structure of the light receiving pixel circuit 132b is provided.

The light receiving pixel circuit 132b is arranged in the light receiving pixel 110b and is connected to any of the plurality of second scanning signal lines 122, any of the plurality of third scanning signal lines 124, any of the plurality of fourth scanning signal lines 126, any of the plurality of detection signal lines 130 and any of the plurality of reset power supply lines 127. The light receiving pixel circuit 132b includes at least a third transistor 137, a fourth transistor 139, a fifth transistor 141, a sixth transistor 143 and a light receiving element 146.

The third transistor 137 functions as a switch for detecting light reception. That is, the third transistor 137 controls the conductive state between the gate of the fourth transistor and an anode of the light receiving element 146 by an ON/OFF operation. The third transistor 137 includes a gate connected to a second scanning signal line 122, a source connected to an anode of the light receiving element 146, and a drain connected to a second node N2.

The fourth transistor 139 is arranged for amplifying a signal of a carrier generated within the light receiving element 146 as a current. That is, when a voltage corresponding to a carrier generated within the light receiving element 146 is applied to the gate, a current corresponding to this voltage flows between the source and drain of the fourth transistor 139. The fourth transistor 139 includes a gate connected to a second node N2, a source connected to a drain of the fifth transistor 141, and a drain connected to a power supply voltage line.

The fifth transistor 141 functions as a switch for detecting an amplified signal. That is, the fifth transistor 141 controls the conductive state between the detection signal line 130 and a source of the fourth transistor 139 by an ON/OFF operation. The fifth transistor 141 includes a gate connected to a third scanning signal line 124, a source connected to a detection signal line 130, and a drain connected to a source of the fourth transistor 139.

The sixth transistor 143 functions as a switch for discharging a carrier generated within a light receiving element 146. That is, the sixth transistor 143 controls the conductive state between a reset power supply line 127 and a second node N2 by an ON/OFF operation. The sixth transistor 143 includes a gate connected to a fourth scanning signal line 126, a source connected to a reset power supply line 127, and a drain connected to a second node N2.

The light receiving element 146 includes an anode connected to the source of the third transistor 137, and a cathode connected to a common voltage line.

A circuit structure of the display device 500 related to the present embodiment was explained above. Next, a driving method of the display device 500 related to the present embodiment is explained

[Driving Method]

According to the driving method the display device 500 related to the present embodiment, one frame period includes a light emitting pixel scanning period and a light receiving pixel scanning period the same as the display device 100 related to the first embodiment.

A light emitting pixel scanning period is a period for writing a signal according to a display image to each of the plurality of light emitting pixels 110a. Since a specific driving method is the same as that explained in the first embodiment, an explanation is omitted here.

A light receiving pixel scanning period is a period for detecting whether each of the plurality of light receiving pixels 110b has received light in the light emitting pixel scanning period. Specifically, the display device 500 in a light receiving pixel scanning period performs the following operation.

In a light receiving pixel scanning period, a scanning line drive circuit 116 selects in sequence each of a plurality of pixel rows according to a timing signal input from a control circuit 114. At this time, the scanning line drive circuit 116 outputs a voltage for turning ON the third transistor 137 to the second scanning signal line 122 connected to a pixel 110 on the pixel row.

When light is absorbed by the light receiving element 146 and a carrier pair accumulates within the light receiving element 146 which turns ON the third transistor 137, a positive charge among the carrier pair flows into the second node N2 and accumulates. In this way, a positive voltage corresponding to the amount of positive charge accumulated in the second node N2 is applied to the gate of the fourth transistor 139.

Next, the scanning line drive circuit 116 outputs a voltage for turning ON the fifth transistor 141 to the third scanning signal line 124 connected to a pixel 110 on the pixel row.

When the fifth transistor 141 is turned ON, a current according to a positive voltage applied to the gate of the fourth transistor 139 flows between the source and drain of the fourth transistor 139. That is, a charge accumulated in the light receiving element 146 is read by a video line/detection signal drive circuit 118 as a current flowing through the fourth transistor 139. In this way, it is possible to detect a touch position.

Next, the charge accumulated in the second node N2 is discharged and the light receiving element 146 is returned to a standby state. The scanning line drive circuit 116 outputs a voltage for turning ON the sixth transistor 143 to the fourth scanning signal line 126 connected to a pixel 110 on the pixel row. When the sixth transistor 143 is turned ON, a reset voltage is supplied from the reset power supply line 127 to the second node N2. In this way, a charge accumulated in the second node N2 is discharged. Here, a reset voltage is a voltage for applying a reverse voltage to the light receiving element 146 and is −5V for example with a voltage of a common voltage line as a reference.

A circuit structure and driving method of the display device 500 related to the present embodiment was explained above. According to the circuit structure and driving method of the display device 500 related to the present embodiment, it is possible to amplify a signal related to light detection. In this way, it is possible to increase a signal ratio related to light detection compared to a noise ratio, and it is possible to provide the display device 500 with improved touch detection accuracy.

The preferred forms of the present invention were explained above. However, these are merely examples and the technical scope of the present invention is not limited to these forms. A person ordinarily skilled in the art may make various modifications without departing from the concept of the present invention. Therefore, such modifications are naturally to be interpreted as belonging to the technical scope of the present invention.

What is claimed is:

1. A display device comprising:
a plurality of pixel electrodes including a first pixel electrode;
a first electrode adjacent to the first pixel electrode and arranged separated from the first pixel electrode;
a bank covering an edge part of the first pixel electrode, an end part of the first electrode, and a region between the first pixel electrode and the first electrode;
a first organic layer arranged above the first pixel electrode, above the first electrode and above the bank;
a second organic layer arranged above the first organic layer overlapping the first pixel electrode;
a third organic layer arranged above the second organic layer, above the first organic layer overlapping the first electrode, and above the first organic layer overlapping the bank;
an opposing electrode arranged above the third organic layer overlapping the first pixel electrode; and
a second electrode arranged above the third organic layer overlapping the first electrode, wherein
a region stacked with the first pixel electrode, the first organic layer, the second organic layer, the third organic layer and the opposing electrode corresponds to a region of a light emitting element, and
a region stacked with the first electrode, the first organic layer, the third organic layer and the second electrode corresponds to a region of a light receiving element.

2. The display device according to claim 1, wherein the opposing electrode is extended across the plurality of pixels continuously.

3. The display device according to claim 1, wherein the opposing electrode and the second electrode are electrically connected.

4. The display device according to claim 1, wherein the first organic layer includes metal phthalocyanine or acene.

5. The display device according to claim 1, wherein the first organic layer is arranged continuously above the pixel electrode, above the first electrode and above the bank, and the third organic layer is arranged continuously above the second organic layer, above the first organic layer overlapping the first electrode, and above the first organic layer overlapping the bank.

6. A display device comprising:
a plurality of pixel electrodes including a first pixel electrode;
a bank covering an edge part of the first pixel electrode, and a region between adjacent pixel electrodes;
a first electrode arranged separated from the first pixel electrode and above the bank;
a first organic layer arranged above the first pixel electrode, above the first electrode and above the bank;
a second organic layer arranged above the first organic layer overlapping the first pixel electrode;
a third organic layer arranged above the second organic layer, above the first organic layer overlapping the first electrode, and above the first organic layer overlapping the bank;
an opposing electrode arranged above the third organic layer overlapping the first pixel electrode; and
a second electrode arranged above the third organic layer overlapping the first electrode, wherein
a region stacked with the first pixel electrode, the first organic layer, the second organic layer, the third organic layer and the opposing electrode corresponds to a region of a light emitting element, and
a region stacked with the first electrode, the first organic layer, the third organic layer and the second electrode corresponds to a region of a light receiving element.

7. The display device according to claim 6, wherein the opposing electrode is extended across the plurality of pixels continuously.

8. The display device according to claim 6, wherein the opposing electrode and the second electrode are electrically connected.

9. The display device according to claim 6, wherein the pixel electrode includes a region overlapping the first electrode via the bank in a planar view.

10. The display device according to claim 6, wherein the first organic layer includes metal phthalocyanine or acene.

11. The display device according to claim 6, wherein the first organic layer is arranged continuously above the first pixel electrode, above the first electrode and above the bank, and the third organic layer is arranged continuously above the second organic layer, above the first organic layer overlapping the first electrode, and above the first organic layer overlapping the bank.

* * * * *